(12) United States Patent
Chen et al.

(10) Patent No.: US 9,406,664 B2
(45) Date of Patent: Aug. 2, 2016

(54) ARRAY SUBSTRATE, METHOD FOR FABRICATING THE SAME AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xi Chen, Beijing (CN); Jianfeng Yuan, Beijing (CN); Qiang Zheng, Beijing (CN); Seungmoo Rim, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 56 days.

(21) Appl. No.: 14/097,778

(22) Filed: Dec. 5, 2013

(65) Prior Publication Data

US 2014/0167079 A1    Jun. 19, 2014

(30) Foreign Application Priority Data

Dec. 14, 2012 (CN) .......................... 2012 1 0546659

(51) Int. Cl.
*H01L 29/18* (2006.01)
*H01L 27/02* (2006.01)
*H01L 27/12* (2006.01)

(52) U.S. Cl.
CPC ........ *H01L 27/0251* (2013.01); *H01L 27/0288* (2013.01); *H01L 27/124* (2013.01); *H01L 27/1214* (2013.01); *H01L 27/1288* (2013.01)

(58) Field of Classification Search
CPC ..................................................... H01L 27/0251
USPC ............................................................. 257/88
See application file for complete search history.

(56) References Cited

U.S. PATENT DOCUMENTS

| 6,897,110 | B1 | 5/2005 | He et al. |
| 2008/0117558 | A1 | 5/2008 | Shih et al. |
| 2010/0001286 | A1* | 1/2010 | Chien ............... G02F 1/136213 257/72 |
| 2010/0091219 | A1 | 4/2010 | Rho et al. |
| 2012/0274882 | A1 | 11/2012 | Jung |
| 2013/0242228 | A1 | 9/2013 | Park et al. |

FOREIGN PATENT DOCUMENTS

| CN | 101188899 A | 5/2008 |
| EP | 0772073 A1 | 5/1997 |

OTHER PUBLICATIONS

Bor-Yiing, Su; Yao-Wen, Chang, "An Exact Jumper Insertion Algorithm for Antenna Effect Avoidance/Fixing", DAC, Jun. 13-17, 2005, 4 (four) pages, Anaheim, California.
English abstract of CN101188899A, listed above, 1 page.
First Office Action (Chinese language) issued by the State Intellectual Property Office ("SIPO") on Oct. 15, 2014 for application No. 201210546659.8, 6 pages.

(Continued)

*Primary Examiner* — Ajay K Arora
(74) *Attorney, Agent, or Firm* — Ladas & Parry LLP

(57) ABSTRACT

An array substrate, a method for fabricating the same and a display device are disclosed. The array substrate comprises a display region, at least two common electrode blocks are disposed at a periphery of the display region and conducted via a pixel electrode bridge line pattern.

14 Claims, 2 Drawing Sheets

(56) References Cited

OTHER PUBLICATIONS

English translation of first Office Action issued by "SIPO" for application No. 201210546659.8, 4 pages.

Extended European Search Report for European Patent Application No. 14150478.7 dated Apr. 24, 2014, 11pgs.

Extended European search report for application 13196149.2 issued by the European Patent Office on Mar. 20, 2014, 7 pages.

* cited by examiner

ARRAY SUBSTRATE, METHOD FOR FABRICATING THE SAME AND DISPLAY DEVICE

CROSS REFERENCE TO RELATED APPLICATIONS

This application claims priority from Chinese National Application No. 201210546659.8 filed on Dec. 14, 2012, the contents of which are incorporated herein by reference.

FIELD OF THE ART

Embodiments of the invention relate to the field of display device fabrication, more particularly, to an array substrate, a method for fabricating the same and a display device.

BACKGROUND

The occurrence ratio of electro-static discharge (ESD) in large-scale display panel development is rather high, and there is no definite solution for defects caused by ESD. It is found by investigation that a crucial reason for the frequent occurrence of ESD defects is the common electrode line fabricated at the same time as the gate layer. Since charges may easily gather on a large area metal sheet, local electric fields tend to be uneven under a plasma environment such as in a Plasma Enhanced Chemical Vapor Deposition (PECVD) device, which may easily cause tip discharge, thereby leading to ESD in different metal layers or electrostatic breakdown.

In conventional technologies, common electrode metal at the periphery of the display region is normally designed as an integral plate, such that the common electrode in the display region of the display panel has a uniform voltage distribution. However, such a design may generate local potential differences, which will cause tip discharge with too large electrostatic energy and easily form ESD defects or electrostatic breakdown.

SUMMARY

Embodiments of the invention provides an array substrate, a method for fabricating the same and a display device, which can reduce electric energy gathering on the common electrode at the periphery of the display region and thereby effectively decrease the possibility of having ESD or electrostatic breakdown before forming the pixel electrode layer film.

An aspect of the invention provides an array substrate comprising a display region, wherein at least two common electrode blocks are disposed at a periphery of the display region and conducted via a pixel electrode bridge line pattern.

As an example, a metal layer bridge line pattern is disposed under the pixel electrode bridge line pattern, an active layer bridge line pattern is disposed under the metal layer bridge line pattern, an insulating layer is disposed under the active layer bridge line pattern and above the at least two common electrode blocks, the pixel electrode bridge line pattern conducts the at least two common electrode blocks through via holes disposed in the insulation layer.

As an example, a protection layer bridge line pattern is disposed between the metal layer bridge line pattern and the pixel electrode bridge line pattern, wherein the protection layer bridge line pattern is a pattern formed by patterning a protection layer, the protection layer overlays the insulation layer above the at least two common electrode blocks.

As an example, the at least two common electrode blocks are a plurality of the common electrode blocks disposed as equally spaced apart.

As an example, lengths of the pixel electrode bridge line patterns between any two of the plurality of the common electrode blocks are equal.

As an example, a width of the pixel electrode bridge line pattern is the same as that of the at least two common electrode blocks.

Another aspect of the invention provides a display device comprising the above array substrate.

Still another aspect of the invention provides a method for fabricating an array substrate comprising:

forming a metal layer on a substrate, and forming at least two common electrode blocks spaced apart from each other at a periphery of a display region on the substrate via a patterning process;

forming an insulation layer on the substrate having the at least two common electrode blocks formed thereon;

forming an active layer bridge line pattern on the insulation layer between the at least two common electrode blocks;

forming a metal layer bridge line pattern on the active layer bridge line patter;

forming a protection layer on the insulation layer above the at least two common electrode blocks;

etching a stack between the common electrode blocks using a mask to form via holes in the insulation layer above the common electrode blocks at both sides of the stack; and forming pixel electrode bridge line pattern interconnecting the at least two common electrode blocks.

As an example, the mask is a single aperture mask or a dual aperture mask.

As an example, a protection layer bridge line pattern is formed on the metal layer bridge line pattern at the same time of forming the protection layer on the insulation layer above the at least two common electrode blocks.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES 1. bridge line; 2. common electrode block; 3. pixel electrode layer bridge line pattern; 4. insulation layer; 5. active layer bridge line pattern; 6. metal layer bridge line pattern; 7. protection layer; 7a. protection layer bridge line pattern; 8. transparent electrode; 9. single-aperture mask; 10. dual-aperture mask; 11a, 11b, 12a, 12b. via hole.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
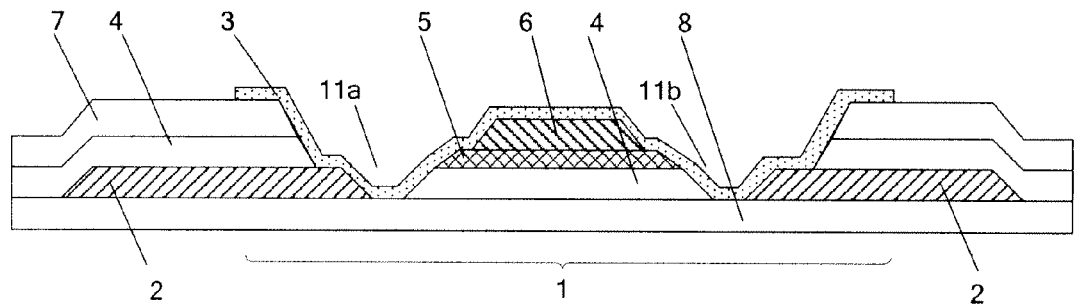
FIG. 1 schematically illustrates a configuration of an array substrate in accordance with an embodiment of the invention.

With reference to FIG. 1, an array substrate is provided in accordance with an embodiment of the invention, which comprises a display region, at least two common electrode blocks 2 are disposed at the periphery of the display region, the common electrode blocks 2 are conducted via a pixel electrode bridge line pattern 3. As illustrated in FIG. 1, the common electrode blocks 2 are disposed on a transparent substrate 8.

As an example, with reference to FIG. 1, a metal layer bridge line pattern 6 is disposed under the pixel electrode bridge line pattern 3, an active layer bridge line pattern 5 is disposed under the metal layer bridge line pattern 6, an insulating layer 4 is disposed under the active layer bridge line pattern 5 and above the common electrode blocks 2, the pixel electrode bridge line pattern 3 conducts the common electrode blocks 2 by way of via holes 11a, 11b disposed on the insulation layer 4. Each of the above bridge line patterns together form a bridge line 1 as illustrated in FIG. 1.

Each pattern layer included in the bridge line 1 is for example formed during the fabrication of a TFT of the array substrate. The pixel electrode bridge line pattern 3 is formed using a transparent conductive material in the same layer as the pixel electrode of the array substrate and through the same patterning process as the pixel electrode layer. The common electrode blocks 2 are formed using the same material and through the same and one patterning process as the gate lines. The active layer bridge line pattern 5 is formed through the same and one patterning process as forming an active layer of the TFT of the array substrate. The metal layer bridge line pattern 6 above the active layer bridge line pattern 5 is formed in the same metal layer as the source/drain of the TFT and through the same and one patterning process as the source/drain of the TFT of the array substrate. By this means, each pattern layer of the bridge line 1 is formed at the same time as the TFT, which can save the cost and shorten the processes. In the embodiment, before forming the pixel electrode layer film, the common electrode at the periphery of the display region of the array substrate is configured as common electrode blocks spaced apart from each other in segments, which can reduce electric energy gathering on the common electrode in a plasma environment such as a PECVD device, thereby preventing ESD or electrostatic breakdown from happening before forming the pixel electrode layer film. After the pixel electrode layer film is formed, the formed pixel electrode bridge line pattern conducts the common electrode blocks spaced apart from each other in segments and a connected common electrode is formed.

Figure 3:
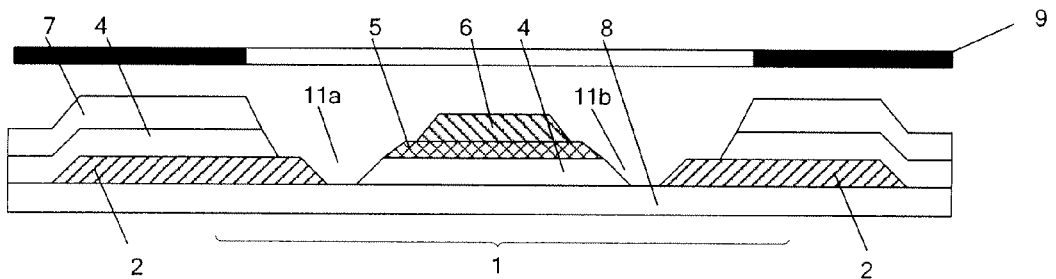
FIG. 3 schematically illustrates a configuration of an array substrate when being fabricated in accordance with an embodiment of the invention.

With reference to FIG. 3, during the fabrication procedure, a single-aperture mask is used in the patterning process to etch each layer of the bridge line 1, thereby forming the via holes 11a, 11b in the insulation layer so as to expose the common electrode blocks 2 at both sides and forming the metal layer bridge line pattern 6. By this means, after forming the pixel electrode bridge line pattern 3 above the metal layer bridge line pattern 6, the pixel electrode bridge line pattern 3 can conduct the common electrode blocks at both sides via bridging. The common electrode thus formed can avoid adversely affecting the conductivity of the common electrode due to too large a resistance of the pixel electrode bridge line pattern 3.

In the array substrate as provided by the above embodiment of the invention, the common electrode at the periphery of the display region is separated into segments, which can reduce electric energy gathering on the common electrode under the plasma environment, thereby effectively decreasing the possibility of having ESD and electrostatic breakdown before forming the pixel electrode layer film.

Figure 2:
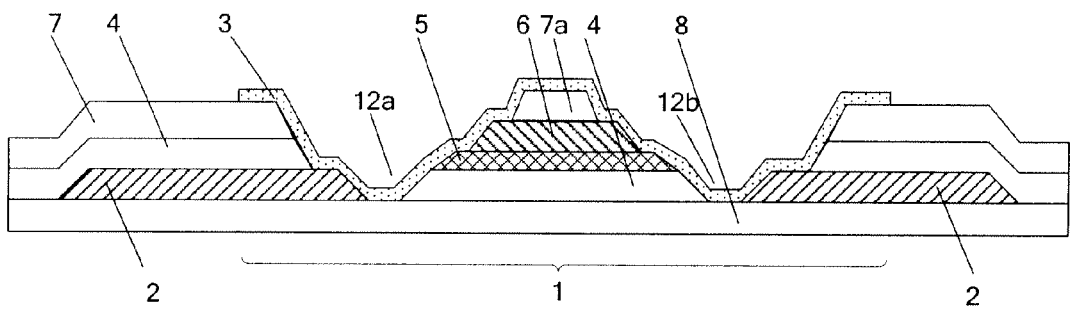
FIG. 2 schematically illustrates a configuration of an array substrate in accordance with another embodiment of the invention.
Figure 4:
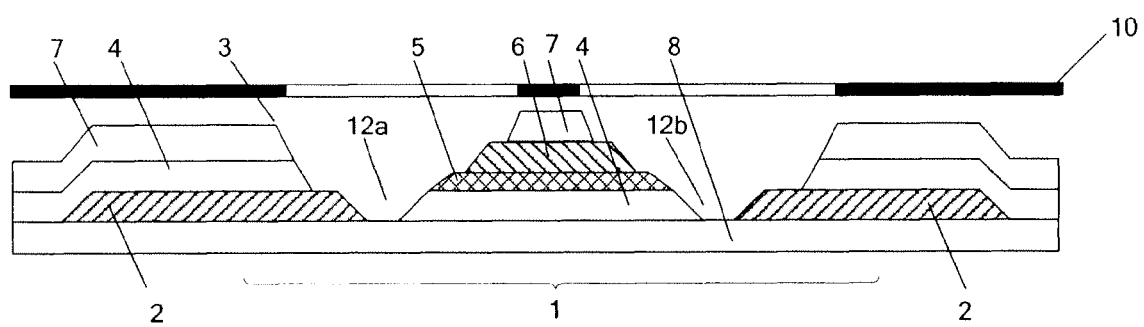
FIG. 4 schematically illustrates a configuration of another array substrate when being fabricated in accordance with an embodiment of the invention.

With reference to FIG. 2, in accordance with another embodiment of the invention, a protection layer bridge line pattern 7a may be further disposed between the metal layer bridge line pattern 6 and the pixel electrode bridge line pattern 3, wherein the protection layer bridge line pattern 7a is a pattern formed by patterning a protection layer 7, the protection layer 7 overlays the insulation layer 4 and above the common electrode blocks 2. With reference to FIG. 4, during the fabrication procedure, a patterning process using a dual-aperture mask is used to etch each layer of the bridge line 1, thereby forming the via holes 12a, 12b in the insulation layer so as to expose the common electrode blocks 2 at both sides and form the metal layer bridge line pattern 6. Moreover, the protection layer bridge line pattern 7a above the metal layer bridge line pattern 6 is formed at the same time. In comparison with the single-aperture mask of a limit-sized aperture as illustrated in FIG. 3, the dual-aperture mask can increase the space between the common electrode blocks, that is, increasing the length of the bridge line 1, such that the possibility of having ESD and electrostatic breakdown in the plasma environment before forming the pixel electrode layer film is further reduced.

The array substrate as provided by the above embodiment of the invention can further reduce electric energy gathering on the common electrode at the periphery of the display region, thereby effectively decreasing the possibility of having ESD and electrostatic breakdown before forming the pixel electrode layer film.

In the above embodiments, the array substrate is described as having two common electrode blocks 2, it is contemplated that the common electrode block 2 may be more than two and they are for example arranged as equally spaced from each other. Accordingly, the lengths of the pixel electrode bridge lines 3 between any two of the adjacent common electrode blocks 2 may be equal. A width of the pixel electrode bridge pattern 3 may be the same as that of the common electrode block 2.

A method for fabricating an array substrate is provided according to another embodiment of the invention, which comprises the following steps:

101, forming a metal layer on a substrate, and forming at least two common electrode blocks spaced apart from each other at the periphery of a display region on the substrate via a patterning process.

For example, a bottom metal film may be fabricated on a transparent substrate via magnetron sputtering. The metal film is generally made of any of molybdenum, aluminum, nickel aluminum alloy, molybdenum tungsten alloy, chrome or copper, or a combination of any of the above materials.

The patterning process in all embodiments of the invention normally comprises applying photoresist to a film to be patterned and forming the required pattern through processes of exposing, developing, etching, peeling, using a mask.

102, forming an insulation layer on the whole substrate having the at least two common electrode blocks formed thereon.

For example, the insulation layer may be deposited via Chemical Vapor Deposition (CVD). The insulation layer is normally made of silicon nitride; it may also be silicon oxide or silicon oxynitride.

103, forming an active layer bridge line pattern on the insulation layer between the at least two common electrode blocks.

For example, a semiconductor film may be formed via sputtering or CVD, and then the active layer bridge line pattern is formed via a patterning process, which is performed at the same time as forming the active layer of the transistor without introducing additional processes. The semiconductor film may be made of oxide semiconductors, such as an oxide semiconductor comprising at least one of indium, gallium or zinc.

104, forming a metal layer bridge line pattern on the active layer bridge line patter.

For example, a metal film may be formed on the gate insulation layer and the active layer bridge line pattern using magnetron sputtering. The metal film is normally made of metals such as molybdenum, aluminum, nickel aluminum alloy, molybdenum tungsten alloy, chrome or copper, or a combination of any of the above materials. The metal layer bridge line pattern is formed through a single patterning process, which may be performed at the same time as forming the source/drain of the transistor, without introducing any additional process.

105, forming a protection layer on the insulation layer above the at least two common electrode blocks.

For example, a protection film normally made of silicon nitride, silicon oxide or silicon oxynitride may be formed using CVD. Then the protection layer overlaying the insulation layer above the at least two common electrode blocks may be formed through a single patterning process.

106, etching the stack between the at least two common electrode blocks using a single-aperture mask to form via holes in the insulation layer above the common electrode blocks at both sides of the stack. In this embodiment, the stack may at least include the insulating layer, the active layer, the metal layer, and the protection layer.

107, forming a pixel electrode bridge line pattern interconnecting the at least two common electrode blocks. At this point, the common electrode blocks are conducted via the pixel electrode bridge line pattern to form the common electrode.

In the above step 101, the at least two common electrode blocks working as the common electrode is disposed at the periphery of the display region and not conducted with each other as they are disposed as spaced apart from each other. When the array substrate is placed in a plasma process environment such as a PECVD device, the common electrode blocks at the periphery of the display region are configured as separated common electrode blocks, which can reduce electric energy gathering on the common electrode, thereby preventing ESD or electrostatic breakdown from happening before forming the pixel electrode film.

Moreover, as the metal layer bridge line pattern is formed at step 104, the pixel electrode bridge line pattern is in contact with the metal layer bridge line pattern, which can ensure good conductivity between the common electrode blocks, thereby avoiding adversely affecting the conductivity of the common electrode due to too large a resistance of the pixel electrode bridge line pattern.

As an example, the step 105 may further comprises forming a protection layer bridge line pattern on the metal layer bridge line pattern.

Alternatively, in step 106, a dual-aperture mask may be used to etch the stack between the common electrode blocks, such that via holes are formed in the insulation layer above the common electrode blocks at both sides of the stack.

The single-aperture mask has a limited aperture size, it is thus necessary to consider the distance between the common electrode blocks set in step 101. However, when the dual-aperture mask is used, the distance between the common electrode blocks can be moderately increased in step 101. That is, the lengths of the bridge lines can be increased, so as to prevent ESD or electrostatic breakdown from happening before forming the pixel electrode film in a better way.

Another embodiment of the invention provides a display device comprising any of the above array substrate. The display device may be a display device such as an E-paper, a mobile phone, a telephone, a digital photoframe and so on.

The display device provided by the embodiment of the invention can reduce electric energy gathering on the common electrode at the periphery of the display region, and effectively decrease the possibility of ESD or electrostatic breakdown before forming the pixel electrode film.

What are described above is related to the illustrative embodiments of the disclosure only and not limitative to the scope of the disclosure; the scopes of the disclosure are defined by the accompanying claims.

What is claimed is:

1. An array substrate comprising a display region, wherein at least two common electrode blocks are disposed at a periphery of the display region and conducted via a pixel electrode bridge line pattern, wherein a metal layer bridge line pattern is disposed under the pixel electrode bridge line pattern, and an active layer bridge line pattern is disposed under the metal layer bridge line pattern, am insulating layer is disposed under the active layer bridge line pattern and above the at least two common electrode blocks, the pixel electrode bridge line pattern conducts the at least two common electrode blocks, through via holes disposed in the insulation layer.

2. The array substrate of claim 1, wherein a protection layer bridge line pattern is disposed between the metal layer bridge line pattern and the pixel electrode bridge line pattern, wherein the protection layer bridge line pattern is a pattern formed by patterning a protection layer, the protection layer overlays the insulation layer above the at least two common electrode blocks.

3. The array substrate of claim 1, wherein the at least two common electrode blocks are a plurality of the common electrode blocks disposed as equally spaced apart.

4. The array substrate of claim 3, wherein lengths of the pixel electrode bridge line patterns between any two of the plurality of the common electrode blocks are equal.

5. The array substrate of claim 1, wherein a width of the pixel electrode bridge line pattern is the same as those of the at least two common electrode blocks.

6. The array substrate of claim 1, wherein the at least two common electrode blocks are a plurality of the common electrode blocks disposed as equally spaced apart.

7. The array substrate of claim 2, wherein the at least two common electrode blocks are a plurality of the common electrode blocks disposed as equally spaced apart.

8. A display device comprising the array substrate of claim 1.

9. A method for fabricating an array substrate comprising:
  forming a metal layer on a substrate, and forming at least two common electrode blocks spaced apart from each other at a periphery of a display region on the substrate via a patterning process;

forming an insulation layer on the substrate having the at least two common electrode blocks formed thereon;

forming an active layer bridge line pattern on the insulation layer between the at least two common electrode blocks;

forming a metal layer bridge line pattern on the active layer bridge line pattern;

forming a protection layer on the insulation layer above the at least two common electrode blocks;

etching a stack between the common electrode blocks using a mask to form via holes in the insulation layer above the common electrode blocks at both sides of the stack; and forming a pixel electrode bridge line pattern interconnecting the at least two common electrode blocks.

10. The method of claim 9, wherein the mask is a single aperture mask.

11. The method of claim 9, wherein the mask is a dual aperture mask.

12. The method of claim 9, wherein a protection layer bridge line pattern is formed on the metal layer bridge line pattern at the same time of forming the protection layer on the insulation layer above the at least two common electrode blocks.

13. The method of claim 10, wherein a protection layer bridge line pattern is formed on the metal layer bridge line pattern at the same time of forming the protection layer on the insulation layer above the at least two common electrode blocks.

14. The method of claim 11, wherein a protection layer bridge line pattern is formed on the metal layer bridge line pattern at the same time of forming the protection layer on the insulation layer above the at least two common electrode blocks.

* * * * *